United States Patent
Zhao et al.

(10) Patent No.: US 6,179,924 B1
(45) Date of Patent: Jan. 30, 2001

(54) HEATER FOR USE IN SUBSTRATE PROCESSING APPARATUS TO DEPOSIT TUNGSTEN

(75) Inventors: Jun Zhao, Cupertino; Talex Sajoto, San Jose; Leonid Selyutin, San Leandro, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/067,618

(22) Filed: Apr. 28, 1998

(51) Int. Cl.[7] .................................................... C23C 16/46
(52) U.S. Cl. ............................................. 118/725; 118/728
(58) Field of Search .................................. 118/715, 725, 118/728

(56) References Cited

U.S. PATENT DOCUMENTS

| | | |
|---|---|---|
| 3,791,342 | 2/1974 | Boyer et al. . |
| 4,790,262 | 12/1988 | Nakayama et al. . |
| 4,854,263 | 8/1989 | Chang et al. . |
| 4,892,753 | 1/1990 | Wang et al. . |
| 4,990,374 | 2/1991 | Keeley et al. . |
| 5,094,885 | 3/1992 | Selbrede . |
| 5,230,741 | 7/1993 | van de Ven et al. . |
| 5,238,499 | 8/1993 | van de Ven et al. . |
| 5,252,807 | * 10/1993 | Chizinsky ........................ 118/724 |
| 5,374,594 | 12/1994 | van de Ven et al. . |
| 5,447,570 | * 9/1995 | Schmitz et al. .................. 118/725 |
| 5,516,367 | * 5/1996 | Lei et al. ........................... 118/728 |
| 5,556,476 | * 9/1996 | Lei et al. ........................... 118/728 |
| 5,688,331 | * 11/1997 | Aruga et al. ...................... 118/725 |
| 5,730,804 | * 3/1998 | Gomi et al. ....................... 118/726 |
| 5,911,834 | * 6/1999 | Fairbairn et al. ................. 118/719 |
| 5,994,678 | * 11/1999 | Zhao et al. ....................... 118/725 |

FOREIGN PATENT DOCUMENTS

| | | |
|---|---|---|
| 0 619 381A | 10/1994 | (EP) . |
| 0 698 674A | 2/1996 | (EP) . |
| 0 708 477A | 4/1996 | (EP) . |
| 0 747 934A | 12/1996 | (EP) . |
| 2 181 458A | 4/1987 | (GB) . |
| 10-041251A | 2/1998 | (JP) . |
| WO 82/01482 | 5/1982 | (WO) . |
| WO 98 29704A | 7/1998 | (WO) . |

* cited by examiner

Primary Examiner—Shrive Beck
Assistant Examiner—Bret Chen
(74) Attorney, Agent, or Firm—Townsend and Townsend and Crew

(57) ABSTRACT

The present invention provides a simplified heater design that is scaleable for equipment processing different diameter substrates and that can efficiently and economically process substrates to meet stringent film requirements such as film uniformity for fabricating high integration devices. The present invention is particularly useful for economically and efficiently producing integrated devices using increasingly larger diameter substrates, such as 12-inch (or 300-mm) diameter and even larger substrates. According to one embodiment, the present invention provides a heater assembly for use in a substrate processing apparatus. The heater assembly includes a metal pedestal including a surface for supporting a substrate, and a resistive heating element disposed in the metal pedestal. The heater assembly also includes a purge gas channel system disposed in the metal pedestal. The purge gas channel system includes a central purge gas inlet located substantially at a center of the metal pedestal. The central purge gas inlet is for providing a purge gas. The purge gas channel system also includes multiple radial purge gas channels radiating from the central purge gas inlet out toward a perimeter of the metal pedestal, and an annular purge gas channel formed in the metal pedestal at the perimeter. The purge gas channels form a substantially symmetric pattern, and each of the purge gas channels are substantially the same length. In a specific embodiment, the assembly includes an annular purge gas channel coupled to the surface via multiple holes near the perimeter to provide a purge guide ring integral to the metal pedestal. Other embodiments of the present invention are also provided.

21 Claims, 11 Drawing Sheets

HEATER FOR USE IN SUBSTRATE PROCESSING APPARATUS TO DEPOSIT TUNGSTEN

BACKGROUND OF THE INVENTION

The present invention relates to semiconductor processing. More specifically, the invention relates to methods and apparatus for uniformly forming various types of films. Embodiments of the present invention are particularly useful to deposit thin films, including metal-containing films such as a tungsten (W) film or a tungsten silicide ($WSi_x$) film, undoped dielectric films such as undoped silicate glass (USG) films, doped dielectric films such as borophosphosilicate glass (BPSG), phosphosilicate glass (PSG) or borophosphosilicate glass (BSG) films, and other films. In addition, other embodiments of the present invention may also be used for economically and efficiently manufacturing semiconductor devices from processing substrates of various diameters.

One of the primary steps in fabricating modern semiconductor devices is forming a film on a semiconductor substrate. As is well known, such a film can be deposited by chemical vapor deposition (CVD). In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film. In general, reaction rates in thermal and plasma processes may be controlled by controlling one or more of the following: temperature, pressure, and reactant gas flow rate.

Semiconductor device geometries have dramatically decreased in size since such devices were first introduced several decades ago. Since then, integrated circuits have generally followed the two-year/half-size rule (often called "Moore's Law") which means that the number of devices which will fit on a chip doubles every two years. Today's wafer fabrication plants are routinely producing 0.35 µm and even 0.25 µm feature size devices, and tomorrow's plants soon will be producing devices having even smaller feature sizes. It is also important that generation of particles in processing chambers be avoided to reduce contamination of substrates that reduces the yield of good devices. It is increasingly important that deposited thin films be of uniform thickness across the substrate for device uniformity.

In substrate processing apparatus, problems may arise because the film deposits not only on the topside of the substrate, as desired, but also undesirably on the edge surfaces and backside of the substrate. Because the deposited film, for example tungsten, may not adhere to the edge and backside surfaces of the silicon substrate, the material deposited on the edge surfaces and backside of the substrate tends to flake off and contaminate the processing chamber. Also, the uneven surface of the substrate due to unwanted deposition on the edge surfaces and backside may undesirably result in, for example, peeling problems in a chemical mechanical polishing (CMP) step or other problems in other subsequent device fabrication steps. For example, these problems have been encountered in CVD chambers used to deposit metals such as tungsten using tungsten hexafluoride ($WF_6$), a highly volatile gas. Edge rings have been used to cover or protect the periphery of the substrate during deposition, thereby preventing the deposition gases from reaching the edge and backside surfaces of the wafer. However, due to the volatility of $WF_6$, for example, the use of a purge gas directed behind or at the edge of the substrate behind the edge ring has been tried. The purge gas exerts a positive pressure that reduces the chance that the processing gas will reach these edge and backside surfaces.

Despite the use of edge rings and purge gases, the deposition of thin films, including a metal film such as tungsten, by CVD may not be as uniform as desired for some applications. With conventional CVD apparatus, uniformity issues with the deposited film may arise due to non-uniform pressures in the purge gas channels. In particular, some conventional CVD apparatus utilize a heater assembly 1, such as shown in FIGS. 1A and 1B, that includes a top metal block 2 to support a substrate 16 thereon, a bottom metal block 3 having a single turn coil resistance heater element 4 embedded therein, and a metal edge ring 5. Edge ring 5 is a separate metal ring that is welded (along its perimeter as indicated by arrows "w") onto top metal block 2. The coil 4 is in contact with the bulk of heater assembly 1 in order to provide uniform heating of top metal block 2 and to uniformly heat substrate 16 mounted thereon. Further, substrate 16 that is vacuum-mounted on such top metal block 2 may be rapidly heated uniformly using heat assembly 1. In such conventional CVD apparatus, edge ring 5 and top metal block 2 form an annular slot 6 through which purge gases from bottom metal block 3 flow between the edge ring and the periphery of the substrate along the edge of top metal block 2 to prevent undesired edge and backside surface deposition on the substrate 16. Various purge channels 7 in a complex linear pattern are formed in the bottom metal block 3 proximate to top metal block 2, as seen in FIG. 1B which illustrates a top view (shown without substrate 16) of heater assembly 1. The purge gas enters via a vertical purge inlet passage 8 through the bottom of the bottom metal block 3 to the center of a main, straight horizontal purge channel 7 along the diameter of the bottom metal block 3 and also to other purge channels 7. Specifically, multiple horizontal purge branch channels, perpendicular to the main purge channel, branch out from the main purge channel and lead to an annular purge channel 9 in bottom metal block 3. From annular purge channel 9, the purge gas flows through slot 6 between edge ring 5 and along the edge of substrate 16 to prevent undesired deposition on substrate 16. Purge gas traveling along these various purge channels 7 often experience different effective pressures at different locations depending on which particular channel 7 the purge gas traveled. The different effective pressures of the purge gas at different locations may result in non-uniformity in the deposited film. Further, such conventional CVD apparatus may experience worsened uniformity problems over time. In such apparatus, the top part of edge ring 5 is bulkier than the narrow welded bottom part of edge ring 5 near bottom metal block 3. For processing temperatures reaching about 400° C., the heavier top part of edge ring 5 tends to warp radially outward away from top metal block 2, which may result in non-uniform purge gas flow due to distortion of slot 6. The edge ring warpage thus results in additional film uniformity issues due to the potentially uneven flow of purge gases along the unevenly warped edge ring. Once the edge ring has begun to warp, the edge ring, which does not return back to its original shape, becomes unusable due to the resulting non-uniform purge gas flow and must be replaced.

In order to more economically and efficiently produce such devices, manufacturers desire to fabricate the devices using increasingly larger diameter substrates, such as 12-inch (or 300-mm) diameter and even larger substrates. Processing larger diameter substrates requires substrate processing equipment to not only physically accommodate such larger substrates but also still meet stringent requirements (for example, adequate substrate heating ability and uniform film deposition) for fabricating high integration devices. However, designing such substrate processing equipment to perform adequately for high performance applications may be an expensive endeavor. For example, the above-described heater assembly 1 having a single turn coil heater element 4 becomes inadequate to provide the heating capability needed to heat larger diameter substrates to deposit uniform films thereon. The above-described heater assembly 1 having metal edge ring 5 welded onto bottom metal block 3 having complex purge channels 7 therein also is difficult to scale for larger diameter substrates without performing extensive experimentation and optimization for uniform purge gas flow and for thin film deposition required for increasingly integrated devices. Further, even if the above-described heater assembly 1 were to be scaled up for larger diameter substrates, the larger diameter of the heater would require an even larger edge ring, which being thin and larger, would be even more likely to warp easily. To avoid costly redesign efforts and warpage problems for heaters for each subsequently larger diameter substrate, it is desirable to provide substrate processing equipment which is scaleable in design for processing different diameter substrates and/or is operable without regard for the diameter of the substrate processed. Such flexibility in substrate processing equipment design can result in greater cost savings and efficiency in substrate processing, especially as processing equipment evolves for larger diameter substrates.

In light of the above, an improved heater assembly that has a simplified design scaleable for equipment processing different diameter substrates is needed to efficiently and economically process substrates to meet stringent film requirements such as film uniformity.

SUMMARY OF THE INVENTION

The present invention is particularly useful for economically and efficiently produce integrated devices using increasingly larger diameter substrates, such as 12-inch (or 300-mm) diameter and even larger substrates. The present invention provides a simplified heater design scaleable for equipment processing different diameter substrates that can efficiently and economically process substrates to meet stringent film requirements such as film uniformity for fabricating high integration devices.

According to one embodiment, the present invention provides a heater assembly for use in a substrate processing apparatus. The heater assembly includes a metal pedestal including a surface for supporting a substrate, and a resistive heating element disposed in the metal pedestal. The heater assembly also includes a purge gas channel system disposed in the metal pedestal. The purge gas channel system includes a central purge gas inlet located substantially at a center of the metal pedestal. The central purge gas inlet is for providing a purge gas. The purge gas channel system also includes multiple radial purge gas channels radiating from the central purge gas inlet out toward a perimeter of the metal pedestal, and an annular purge gas channel formed in the metal pedestal at the perimeter. The purge gas channels form a substantially symmetric pattern, and each of the purge gas channels has substantially the same length. In a specific embodiment, the assembly includes an annular purge gas channel coupled to the surface via multiple holes near the perimeter to provide a purge guide ring integral to the metal pedestal. According to specific embodiments, the heater assembly also includes a vacuum chucking system formed in the metal pedestal. In other specific embodiments, the metal pedestal is capable of supporting and uniformly heating a substrate having a 300-mm diameter or greater.

According to another embodiment, the present invention provides a substrate processing system that includes a processing chamber and a heating system. The heating system includes a heater assembly capable of holding a substrate and capable of heating to a selected temperature. The heater assembly includes a metal pedestal having a surface for supporting the substrate, a resistive heater element providing uniform heating of the surface, and a central purge gas inlet for providing a purge gas. The central purge gas inlet is located substantially at a center of the metal pedestal. The heater assembly also includes multiple radial purge gas channels formed in the metal pedestal, where the radial purge channels radiate from the central purge gas inlet out toward a perimeter of the metal pedestal to form a substantially symmetric pattern. The heater assembly also includes an annular purge gas channel formed in the metal pedestal at the perimeter. The annular purge gas channel is coupled to the surface via multiple holes near the perimeter to provide an integrated edge purge guide in the metal pedestal.

These and other embodiments of the present invention, as well as its advantages and features, are described in more detail in conjunction with the text below and attached figures.

DESCRIPTION OF THE SPECIFIC EMBODIMENTS

I. Introduction

The apparatus of the present invention allows for deposition of a uniform thin film such as a tungsten film. Films deposited with the apparatus of the present invention are suitable for use in the fabrication of integrated circuits having small device geometries. In particular, such apparatus may be used to deposit metal-containing films, undoped dielectric films, doped dielectric films, and other films. Such films may be used in forming metal interconnection lines, ultra-shallow doped regions, premetal dielectric layers, intermetal dielectric layers, capping layers, oxide filling layers, or other layers.

In addition to being used to deposit various types of uniform thin films, the apparatus according to the present invention advantageously has the capability of being easily scaled for larger diameter substrates or being operable with CVD apparatus equipped for substrates of any diameter. Further, the apparatus of the present invention can deposit a uniform thin film on wafer surfaces, as desired, while avoiding contamination from undesired film deposits. Although the apparatus is described below in the context of depositing a uniform thin tungsten film, it should be recognized that the present invention is not so limited.

II. Exemplary CVD Reactor Chamber

Figure 2A:
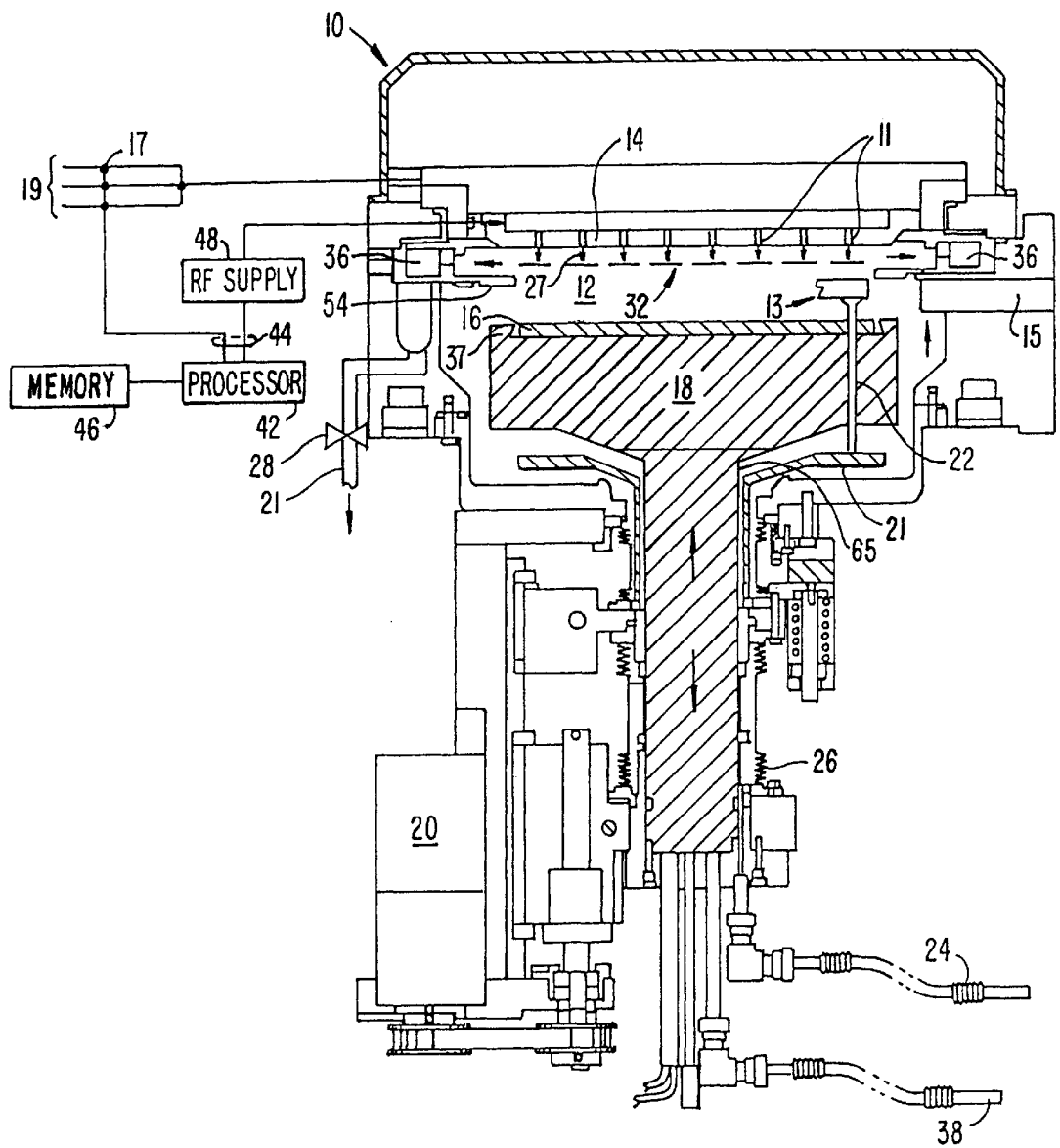
FIG. 2A is a vertical, cross-sectional view of one embodiment of a chemical vapor deposition apparatus according to the present invention.
Figure 2B:
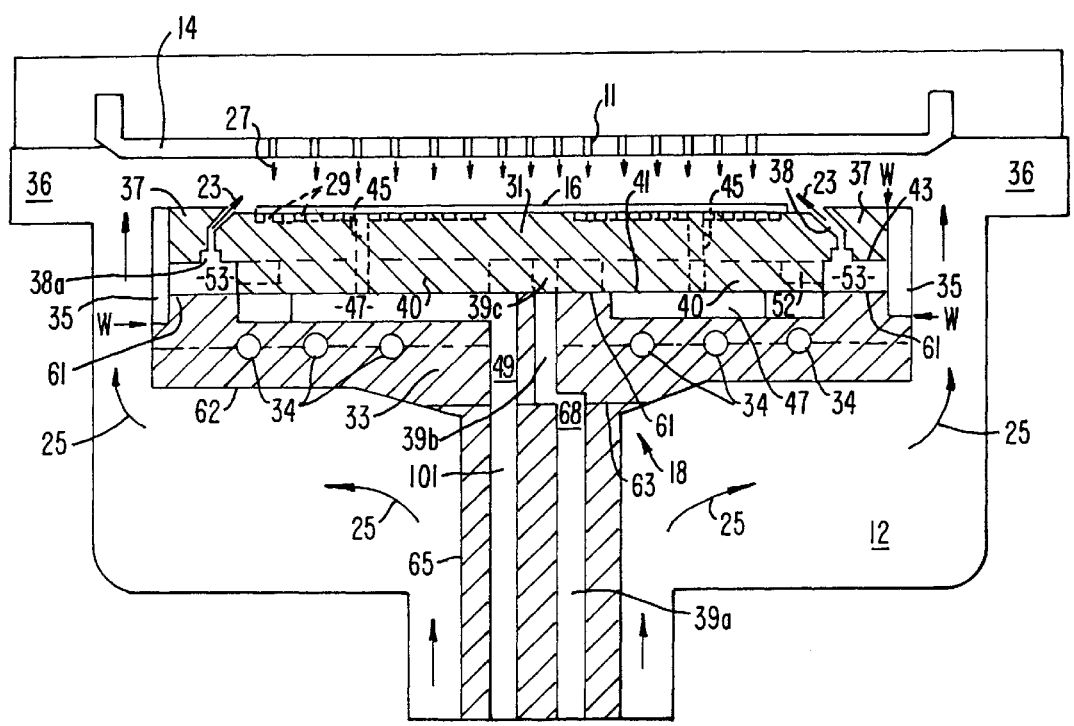
FIG. 2B is a vertical, simplified cross-sectional view of one embodiment of a resistively-heated heater/susceptor used in the chamber of FIG. 2A to support a substrate being processed in chamber.

FIGS. 2A and 2B illustrate one embodiment of a parallel plate, cold-wall chemical vapor deposition system 10 having a vacuum chamber 12 in which uniform thin films such as tungsten films according to the present invention can be deposited. CVD system 10 contains a gas distribution manifold 14 having a pattern of holes 11 therethrough for dispersing process gases to a substrate or wafer 16 that rests on a resistively-heated susceptor/heater 18.

Chamber 12 may be part of a vacuum processing system having multiple processing chambers connected to a central transfer chamber and serviced by a robot. Substrate 16 is brought into chamber 12 by a robot blade through a slit valve 15 in a sidewall of the chamber. Heater 18 having a shaft 65 is moveable vertically between processing positions and a lower loading position using a motor 20 coupled to a lift mechanism, examples of which are described in detail in commonly-assigned U.S. patent application Ser. No. 08/738,240, (filed on Oct. 25, 1996 and having inventors Leonid Selyutin and Jun Zhao), entitled "Self-Aligning Lift Mechanism," and in commonly-assigned U.S. patent application Ser. No. 08/892,612 (filed on Jul. 14, 1997 and having inventors Leonid Selyutin, Talex Sajoto and Jun Zhao), entitled "Improved Self-Aligning Lift Mechanism," the disclosures of which are herein incorporated by reference. Lift pins 22 are slidable within heater 18 but are kept from falling out by conical heads on their upper ends. The lower ends of lift pins 22 may be engaged with a vertically movable lifting ring 21 and thus can be lifted above the heater's surface. With heater 18 in a lower loading position (slightly lower than slit valve 15, as seen in FIG. 2A), a robot blade (not shown) in cooperation with the lift pins and the lifting ring transfers substrate 16 in and out of chamber 12 through the slit valve 15, which can be vacuum-sealed to prevent the flow of gas into or out of the chamber through slit valve 15. Substrate 16 in a first position 13 opposite the slit valve is brought into the chamber when heater 18 is in the lower loading position. At position 13, substrate 16 is supported initially by the set of lift pins 22 that pass through corresponding lift pin holes (not shown in FIG. 2A) in heater 18 and are coupled to heater 18. Pins 22 are driven by a single motor assembly. Lift pins 22 raise an inserted wafer (not shown) off the robot blade, and then heater 18 rises to raise the wafer off the lift pins onto the wafer pocket on the upper surface of the heater. A suitable robotic transfer assembly is described in commonly-assigned U.S. Pat. No. 4,951,601, issued to Maydan, the complete disclosure of which is incorporated herein by reference.

Figure 1A:
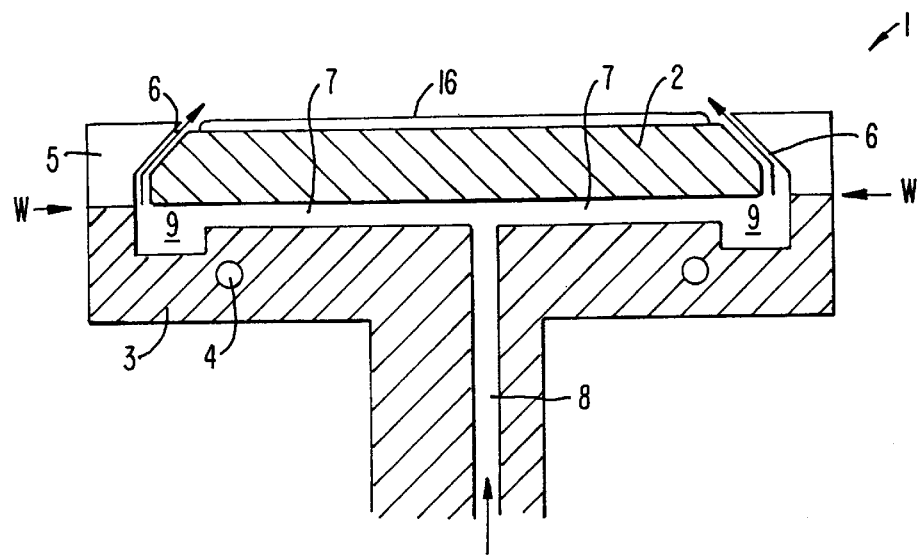
FIG. 1A is a simplified vertical, cross-sectional view of a prior art heater assembly 1.
Figure 1B:
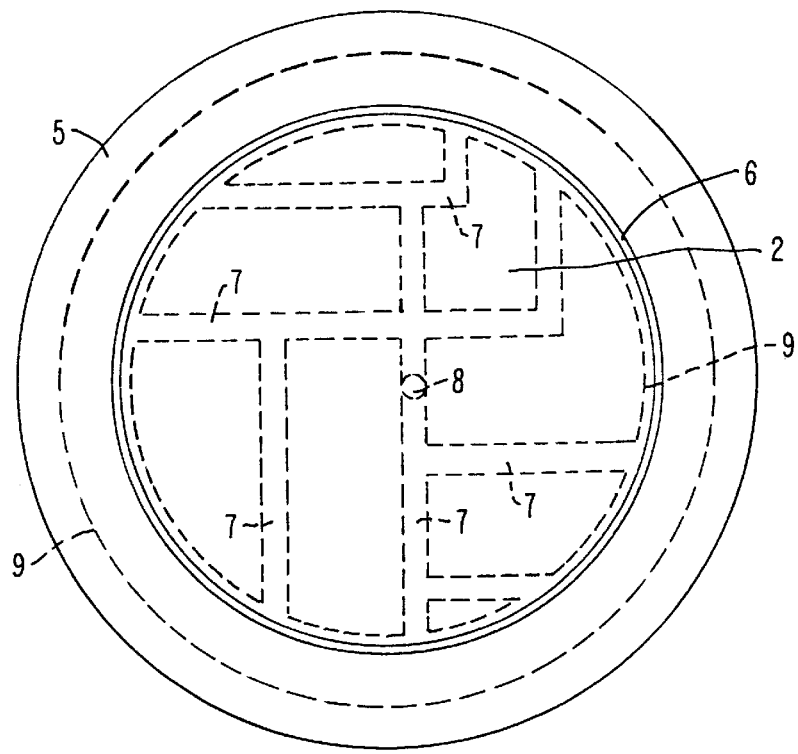
FIG. 1B is a simplified top view of the heater assembly 1 of FIG. 1A.

As heater 18 is brought to a processing position 32 (as shown by the dotted line) opposite gas distribution manifold 14, pins 22 sink into heater 18 and substrate 16 is deposited onto the top surface of heater 18. In particular, the present invention provides a heater assembly 18, shown in more detail in FIG. 2B, that includes a top metal block 31 to support a substrate 16 thereon, a bottom metal block 33 having a multiple loop (three loops in the specific embodiment) resistance heater element 34 embedded therein, and a metal edge support ring 35. Top metal block 31, bottom metal block 33 and metal edge support ring 35 may be made of aluminum or other metal. Top metal block 31 also includes an integrated edge ring 37, formed by multiple edge purge gas nozzles 38 through top metal block 31. Nozzles 38 are uniformly located and arranged in a circle having a radius less than the outer radius of top metal block 31. Nozzles 38, which are shown simplified in FIG. 2B, are described in further detail below. Edge ring 37 is an integral part of top metal block 31. Specific embodiments of edge ring 37, which is shown simplified in FIGS. 2A–2B, are described in further detail below in relation to substrate 16 in FIGS. 3A–3E. Advantageously, formation of edge ring 37 as part of the top metal block 31 prevents warpage of the edge ring often experienced in conventional heater assemblies, as described earlier, of FIGS. 1A and 1B at processing temperatures reaching about 400° C. or greater. Heater 18 of the present invention results in a uniform edge purge gas flow due to nozzles 38 being formed in a fixed position in the bulk metal of top metal block 31. Heater element 34 is embedded in bottom metal block 33 of heater assembly 18 in order to provide uniform heating of top metal block 31 and to uniformly heat substrate 16 mounted thereon.

Figure 3A:
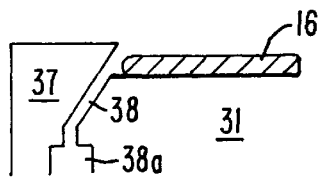
FIGS. 3A–3E show exemplary cross-sectional diagrams of substrate 16 in relation to integral edge ring 37 according to various specific embodiments of the present invention.
Figure 3B:
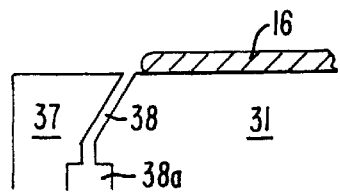
Figure 3C:
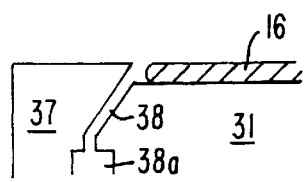
Figure 3D:
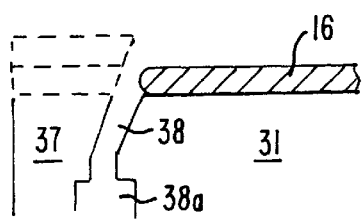
Figure 3E:
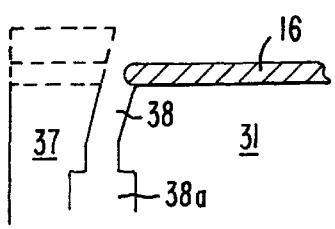

FIGS. 3A–3E show exemplary cross-sectional diagrams of substrate 16 in relation to integral edge ring 37 according to various specific embodiments of the present invention. FIGS. 3A, 3B and 3C illustrate embodiments of edge ring 37 which form a deep pocket, flat pocket and shallow pocket, respectively, for substrate 16 to rest on the top surface of top metal block 31 of heater assembly 18. In FIGS. 3A–3C, substrate 16 is located on top metal block 31 such that some space on top metal block 31 remains exposed by the edge of substrate 16. In FIG. 3D, substrate 16 is located on top metal block 31 such that no space on top metal block 31 remains exposed by the edge of substrate 16, which is flush with the opening of nozzles 38. In FIG. 3E, substrate 16 is located on top metal block 31 such that no space on top metal block 31 remains exposed by the edge of substrate 16, which overhangs a portion of the opening of nozzles 38. FIGS. 3D–3E also show the various embodiments of edge ring 37 (similar to those illustrated in FIGS. 3A–3C) in dotted lines. Of course, the outer diameter of the particular size substrate should be less than the inner diameter of edge ring 37 so that the substrate is able to be appropriately supported by heater assembly 18.

Once positioned on heater 18, substrate 16 is affixed to the top of heater 18 by a vacuum clamping or chucking system. As seen in FIG. 2B, vacuum clamping system includes multiple grooves 29 formed in the top surface of top metal block 31, multiple vertical vacuum conduits 45 (of which only two are shown in FIG. 2B) through top metal block 31 which lead to grooves 29, vacuum passages 47 leading to vertical vacuum conduits 45, and a vertical vacuum inlet 49 leading to vacuum passages 47. The clamping system is maintained at vacuum by coupling vertical vacuum inlet 49, which enters heater assembly 18 through the bottom of bottom metal block 33, to a pumping system located away from chamber 12. A specific embodiment of clamping system is described in further detail below. Being vacuum-mounted via vacuum grooves 29 on such top metal block 31, substrate 16 may be rapidly and uniformly heated using heat assembly 18. Vacuum chucking of substrate 16 improves thermal contact resulting in better temperature control and uniformity.

Deposition and carrier gases are supplied through gas lines 19 to manifold 14 in response to the control of valves or mass flow controllers (MFC) 17. During processing, gas supplied to manifold 14 is distributed uniformly across the surface of the substrate as shown by arrows 27. Spent processing gases and by-product gases are exhausted from the chamber by means of exhaust system 36. The rate at which gases are released through exhaust system 36 into an exhaust line 21 is controlled by a throttle valve 28.

As heater 18 moves upward toward processing position 32, substrate 16 contacts shadow ring 54 which protects the top edges of substrate 16 from unwanted deposition. Purge gases 25 also may be flowed around heater 18 to minimize deposition on an around heater 18. These purge gases 25 are supplied from a purge line (FIG. 2A, 24) and are also employed to protect stainless steel bellows 26 from damage by corrosive gases introduced into the chamber during processing. During deposition, edge purge gases 23 are flowed across the edge of substrate 16 to prevent deposition gases from contacting the edge and backside of the substrate. Edge purge gas 23 enters vertical purge inlet passage 39a within shaft 65 and passes through vertical purge passage 39b in bottom metal block 33 to the central juncture 39c of multiple purge channels 40 formed in the bottom surface of top metal block 31. The edge purge gas 23 then flows through multiple purge gas channels 40 leading to an annular purge channel 53 to multiple edge purge nozzles 38. Between annular purge channel 53 and each edge purge nozzle 38 is an intermediate nozzle channel 38a described below. Edge purge gas 23 flows from edge purge nozzles 38 (FIG. 2A) against the edge of wafer 16, as will be described in further detail below.

An RF power supply 48 can be coupled to manifold 14 to provide for top-powered plasma-enhanced CVD (PECVD) cleaning of the chamber. Bottom-powered PECVD cleaning also may be provided in other embodiments. Alternatively, a remote microwave plasma system (not shown) can be coupled to manifold 14 or otherwise coupled to the chamber to provide for a remote plasma clean of the chamber.

A. System control

The throttle valve 28, gas supply valves/MFCs 17, motor 20 and lift mechanism, resistive heater element in heater 18, RF power supply 48 and other aspects of CVD system 10 are controlled by a processor 42 over control lines 44 (only some of which are shown). Processor 42 operates under the control of a computer program stored in a computer-readable medium such as a memory 46. The computer program dictates the temperature, chamber pressure, timing, mixture, of gases, RF power levels, heater position, and other parameters of a particular process.

In a preferred embodiment, the system controller includes a hard disk drive (memory 46) a floppy disk drive and a processor 42. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 42 controls all of the activities of the CVD machine. The system controller executes system control software, which is a computer program stored in a computer-readable medium such as a memory 46. Preferably, memory 46 is a hard disk drive, but memory 46 may also be other kinds of memory. The computer program includes sets of instructions that dictate the timing, mixture of gases, chamber pressure, chamber temperature, RF power levels, heater position, and other parameters of a particular process. Other computer programs stored on other memory devices including, for example, a floppy disk or other another appropriate drive, may also be used to operate controller 42.

Figure 2C:
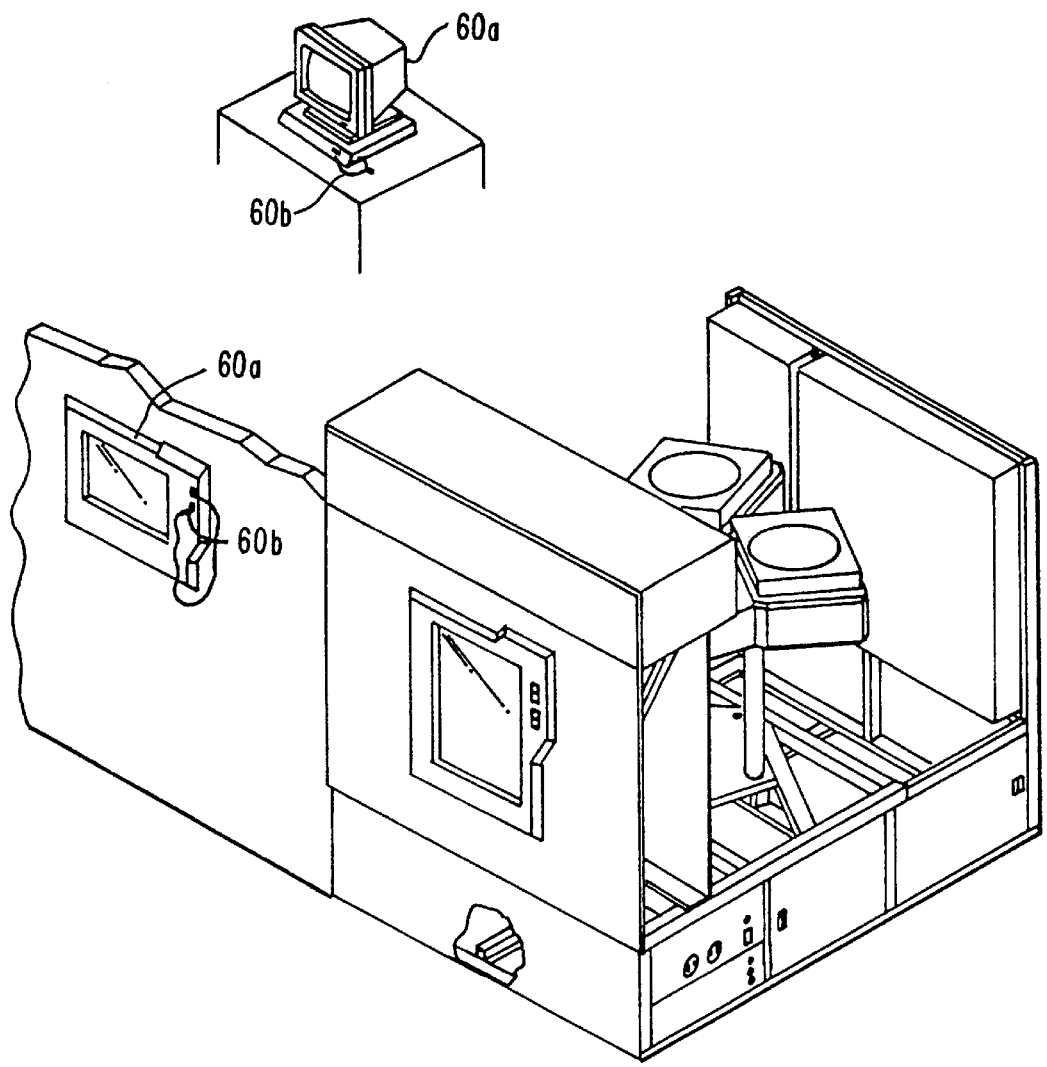
FIG. 2C is a simplified diagram of system monitor and CVD system 10 in a multi-chamber system.

The interface between a user and controller 42 is via a CRT monitor 60a and light pen 60b, shown in FIG. 2C which is a simplified diagram of the system monitor and CVD system 10 in a substrate processing system, which may include one or more chambers. In the preferred embodiment two monitors 60a are used, one mounted in the clean room wall for the operators and the other behind the wall for the service technicians. The monitors 60a simultaneously display the same information, but only one light pen 60b is enabled. A light sensor in the tip of light pen 60b detects light emitted by CRT display. To select a particular screen or function, the operator touches a designated area of the display screen and pushes the button on the pen 60b. The touched area changes its highlighted color, or a new menu or screen is displayed, confirming communication between the light pen and the display screen. Other devices, such as a keyboard, mouse, or other pointing or communication device, may be used instead of or in addition to light pen 60b to allow the user to communicate with controller 42.

The process for depositing the film can be implemented using a computer program product that is executed by controller 42. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled WINDOWS™ library routines. To execute the linked, compiled object code the system user invokes the object code, causing the computer system to load the code in memory. The CPU then reads and executes the code to perform the tasks identified in the program.

Figure 2D:
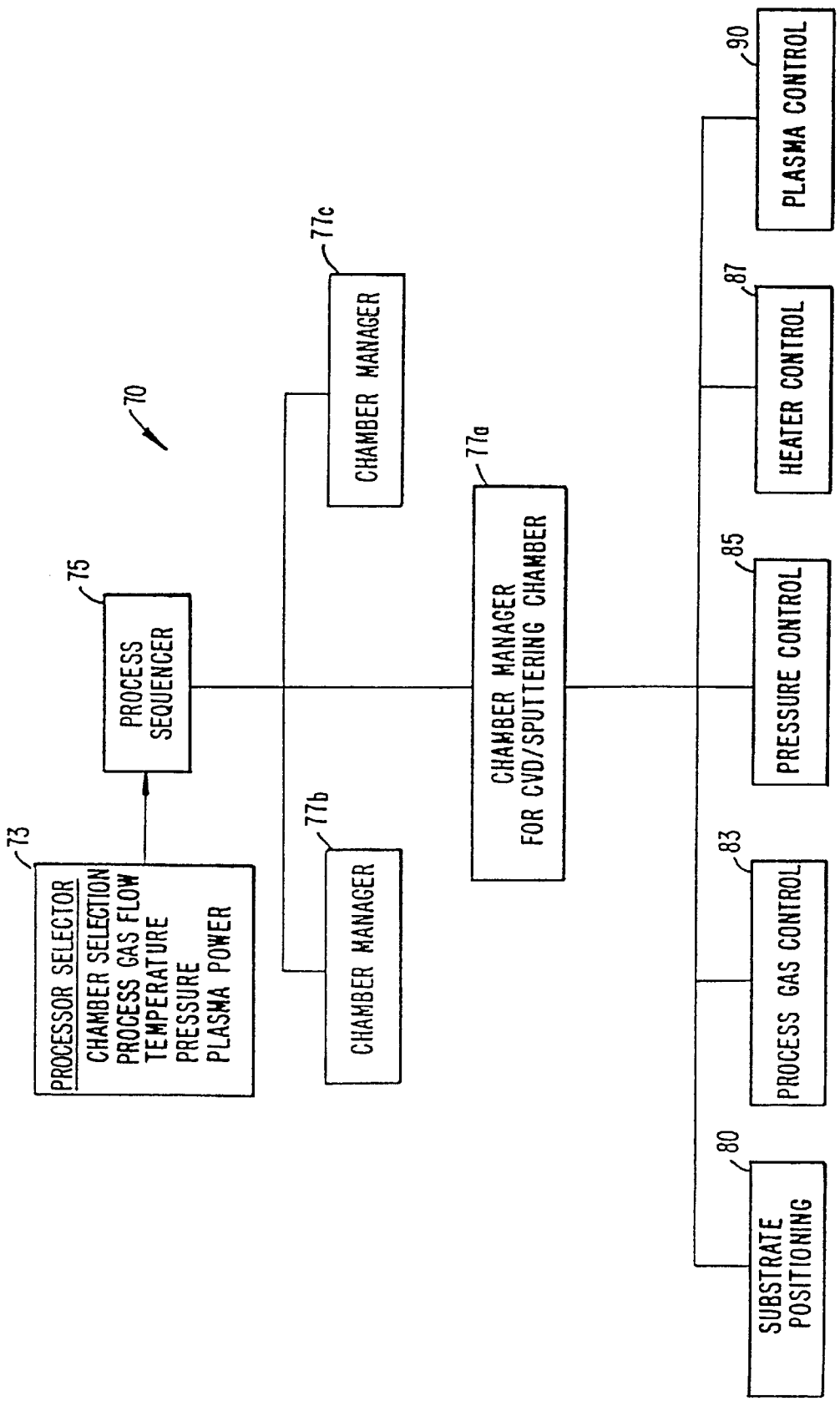
FIG. 2D shows an illustrative block diagram of the hierarchical control structure of the system control software, computer program 70, according to a specific embodiment.

FIG. 2D is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 12 according to the process set determined by the sequencer subroutine 75. For example, the chamber manager subroutine 77a comprises program code for controlling sputtering and CVD process operations in the process chamber 12. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87 and plasma control subroutine 90 in some embodiments. A person having ordinary skill in the art will readily recognize that other chamber control subroutines can be included depending on what processes are to be performed in the process chamber 12. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 12 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 2D. The substrate positioning subroutine 80 comprises program code for controlling chamber components that are used to load the substrate onto heater 18 and, optionally, to lift the substrate to a desired height in the chamber 12 to control the spacing between the substrate and the gas distribution manifold 14. When a substrate is loaded into the process chamber 12, heater 18 is lowered to receive the substrate, and thereafter, heater 18 is raised to the desired height in the chamber, to maintain the substrate at a first distance or spacing from the gas distribution manifold 14 during the CVD process. In operation, the substrate positioning subroutine 80 controls movement of heater 18 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 12 to stabilize the pressure in the chamber before reactive process gases are introduced. For these processes, the process gas control subroutine 83 is programmed to include steps for flowing the inert gas into the chamber 12 for an amount of time necessary to stabilize the pressure in the chamber, and then the steps described above would be carried out.

The pressure control subroutine 85 comprises program code for controlling the pressure in the chamber 12 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 12 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 12 to the desired pressure.

The heater control subroutine 87 comprises program code for controlling the current to a heating unit that is used to heat the substrate 16. The heater control subroutine 87 is also invoked by the chamber manager subroutine 77a and receives a target, or set-point, temperature parameter. The heater control subroutine 87 measures the temperature by measuring voltage output of a thermocouple located in heater 18, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded heater element is used to heat heater 18 the heater control subroutine 87 gradually controls a ramp up/down of current applied to the heater element. Additionally, a built-in fail-safe mode can be included to detect process safety compliance, and can shut down operation of the heater if the process chamber 12 is not properly set up.

In some embodiments, chamber 12 is outfitted with an RF power supply 48 that is used for chamber cleaning or other operations. When a chamber cleaning plasma process is employed, plasma control subroutine 90 comprises program code for setting the frequency RF power levels applied to the process electrodes in the chamber 12. Similar to the previously described chamber component subroutines, the plasma control subroutine 90 is invoked by the chamber manager subroutine 77a.

The above general CVD system description is an example of a substrate processing system mainly for illustrative purposes with which the present invention may be used and should not be considered as limiting the scope of the present invention. Variations of the above described system such as location of RF power connections and others are possible. The present invention is not necessarily limited to any specific processing apparatus.

B. Heater Assembly

FIG. 2B is a vertical, simplified cross-sectional view of one embodiment of a resistively-heated pedestal assembly 18 used in the substrate processing system of FIG. 2A to support a substrate 16 being processed in chamber 12. In accordance with the present invention, heater assembly 18 includes top metal block 31 to support a substrate 16 thereon, bottom metal block 33 having a multiple loop resistance heater element 34 embedded therein, and metal edge support ring 35. The bottom surface of top metal block 31 is preferably brazed to the top surface of bottom metal block 33 to provide maximum thermal transfer between top and bottom metal blocks 31 and 33. In some embodiments, top and bottom metal blocks 31 and 33 are brazed together; while, in other embodiments, top and bottom metal blocks 31 and 33 and shaft 65 may be brazed together. Top metal block 31 has a thickness of about 0.500–0.700 inch and bottom metal block 33 has a thickness of about 1.30–1.55 inches in specific embodiments. Metal edge support ring 35 is disposed to fit around the outermost perimeter of top metal block 31 and to provide edge support for top metal block 31 in relation to bottom metal block 33. Edge support ring 35 has a thickness of about 0.15–0.25 inch in specific embodiments. Of course, both top and bottom metal blocks 31 and 33 of heater 18 have multiple (for example, three) lift pin holes 49 disposed therethrough to allow lift pins through ceramic sleeves fitted in holes 49 to lift the substrate on and off heater 18. In a specific embodiment, top and bottom metal blocks 31 and 33 and metal edge support ring 35 are made of aluminum. Support ring 35 extends along at least a portion of the sides of top and bottom metal blocks 31 and 33 and forms the outer side wall of annular purge channel 53 to seal off the purge gas in channel 53. As mentioned earlier, heater assembly 18 also includes an integral edge ring 37 formed with multiple nozzles 38 formed in top metal block 31. Support ring 35 also provides additional stability to edge ring 37 in relation to top metal block 31. According to the specific embodiment, edge support ring 35 is welded to the aluminum metal blocks 31 and 33 and welded to the outer edge of edge ring 37. Preferably, the welding is done by electron beam welding, and is indicated by arrows labeled "w" in FIG. 2B. Of course, in other specific embodiments, blocks 31 and 33 and ring 35 may be made of different materials and bonded to each other in different ways (such as brazed, welded, or otherwise connected).

Figure 4A:
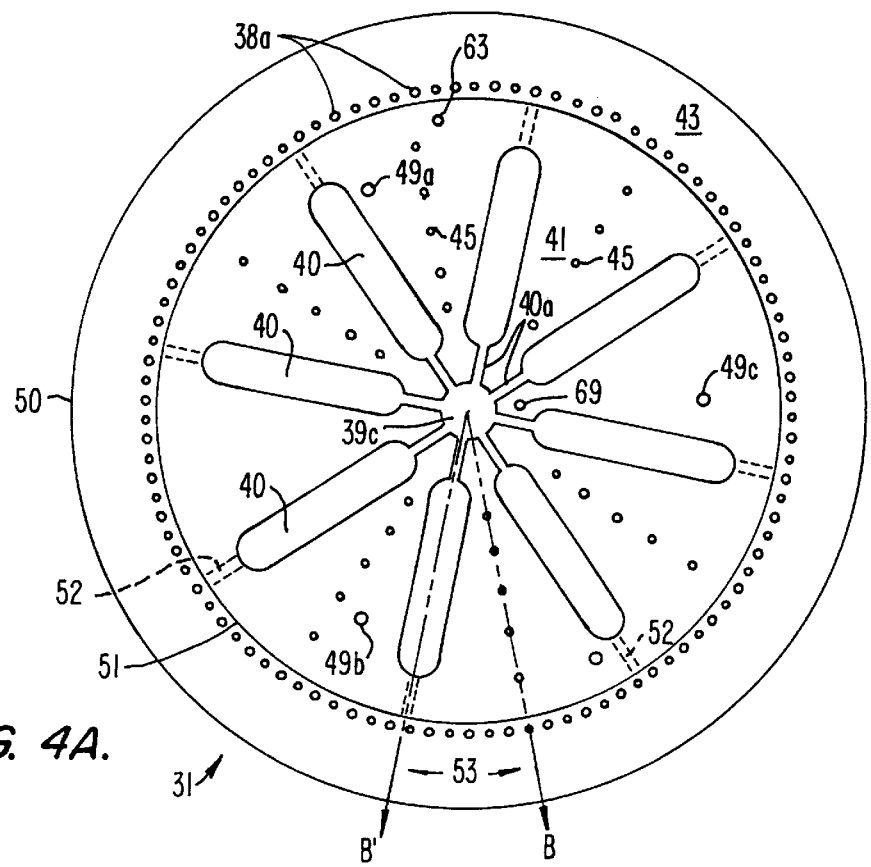
FIGS. 4A and 4B are bottom and top views, respectively, of one embodiment of a top metal block 31 of heater assembly 18 shown in FIG. 2B.
Figure 4B:
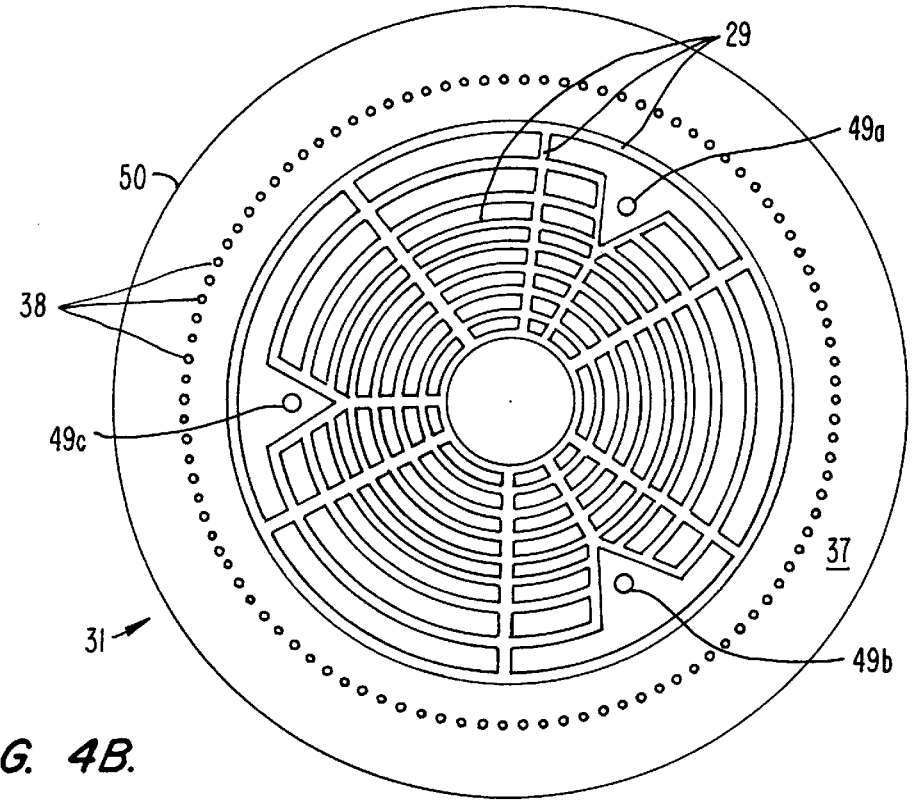
Figure 5A:
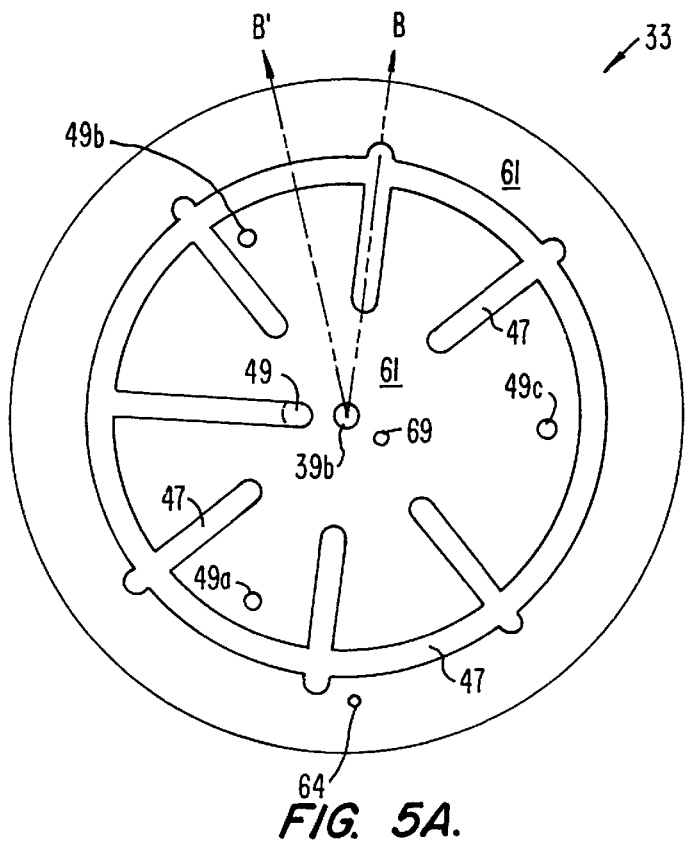
FIGS. 5A and 5B are top and bottom views, respectively, of one embodiment of a bottom metal block 33 of heater assembly 18 of FIG. 2B.
Figure 5B:
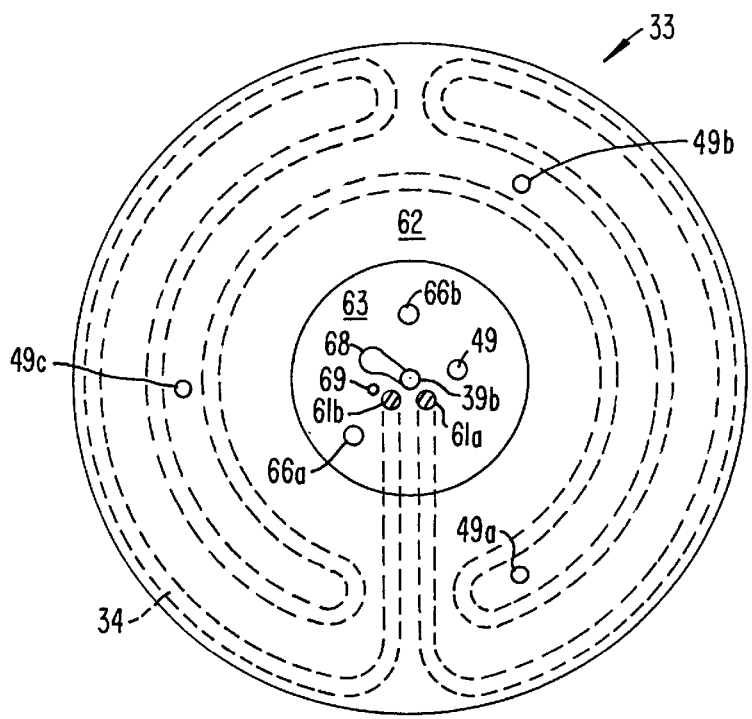
Figure 6:
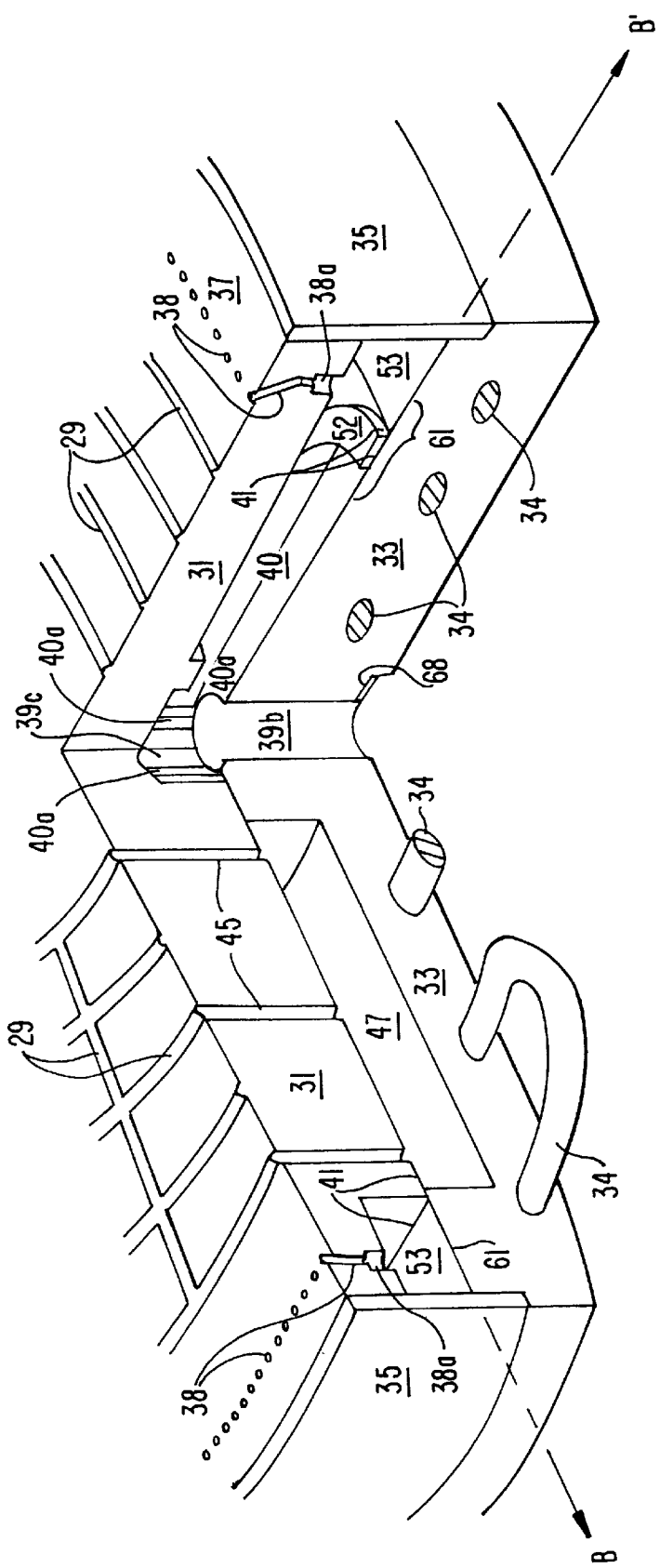
FIG. 6 is a three-dimensional partial cutout view of a specific embodiment of heater assembly 18 shown without shaft 65.

As will be described further below in relation to FIGS. 2B, 4A–4B, 5A–5B and 6, heater assembly 18 is formed, once top and bottom metal blocks 31 and 33 are aligned and connected together with edge support ring 35. In particular, FIGS. 4A and 4B are bottom and top views, respectively, of one embodiment of a top metal block 31 of heater assembly 18 shown in FIG. 2B. FIGS. 5A and 5B are top and bottom views, respectively, of one embodiment of a bottom metal block 33 of heater assembly 18 of FIG. 2B. The bottom of top metal block 31 faces the top of bottom metal block 33 when forming the heater assembly 18. FIG. 6 illustrates a three-dimensional partial cutout view (along line B–B', as seen in FIGS. 4A and 5A) of a specific embodiment of heater assembly 18 shown without shaft 65. It should be noted that FIGS. 2A–2B, 4A–4B, 5A–5B, 6, and 7A–7B are not to scale.

According to the specific embodiment, heater element 34 is a multi-loop heating element made of conventional material (e.g., nichrome wire surrounded with MgO isolation within a metal sheath) that is embedded in bottom metal block 33 of heater assembly 18. Being cast in bottom metal block 33 in preferred embodiments, element 34 (using an Incoloy™, Inconel™ or stainless steel sheath or other sheath material suitable for casting/welding embodiments which require high temperatures for which aluminum sheath material is unsuitable) provides good contact with the bulk of heater 18 to provide uniform heating of top and bottom metal blocks 31 and 33 and uniform heating substrate 16 mounted thereon. In other embodiments, heating element 34 may be brazed between a top and bottom half (e.g., as shown in dash-dotted line in FIG. 2B) of bottom metal block 33, and heating element 34 may have an aluminum sheath or other material (compatible for brazing to the bulk heater material).

Heater assembly 18 provides edge purge gas to prevent unwanted deposition on the backside and edge of substrate 16. According to a specific embodiment, FIGS. 4A and 4B show bottom and top views, respectively, of top metal block 31 illustrated in FIG. 2B. As previously discussed, the edge purge gas 23 passes through vertical purge inlet passage 39a in shaft 65 to vertical purge inlet passage 39b in bottom metal block 33 and then to central juncture 39c of multiple purge channels 40 formed in the bottom surface of top metal block 31. According to specific embodiments, vertical purge inlet passage 39b has a diameter of about 0.250–0.500 inch and central juncture 39c has a diameter of about 0.500–1.00 inch. Formed (shown in dotted lines in FIG. 2B) in the bottom surface 41 of top metal block 31, purge channels 40 radiate outwardly from central juncture 39c toward the outer perimeter of top metal block 31. Coming out from central juncture 39c to each of the purge channels 40 are channel conduits 40a, which have a diameter or width (depending on whether a circular or rectangular dimension) of about 0.170–0.190 inch. In other embodiments, channel conduits 40*a* could have a shape tapered from center juncture 39*c* to the opening of each channel 40. Purge channels 40 have a width of about 0.250–0.350 inch and a length of about 2.5–3.75 inches in specific embodiments. The larger width of purge channels 40 compared to the width of channel conduits 40*a* serves to reduce the pressure drop encountered by the edge purge gas and to increase conductance of the gas flow, thereby preventing turbulent flow. The width and length of purge channels 40 also are optimized to prevent turbulence of edge purge gas 23 within channels 40 due to the pressure at entrance from vertical purge inlet passages 39*a–b* via center juncture 39*c*. The top and side surfaces of purge channels 40 are preferably milled from top metal block 31, and the bottom surface of purge channels 40 are provided by the top surface 61 of bottom metal block 33, as seen in FIG. 6. In a preferred embodiment, the edges of purge channels 40 are curved for turbulence considerations, as seen in FIG. 4A. Purge channels 40 are uniformly located and preferably provide a symmetric and an easily scaleable design. Appropriate locations of top metal block 31 have drilled holes 52 (shown by dotted lines in FIG. 4A) from the inner side perimeter 51 through to each of the multiple purge channels 40. In specific embodiments, holes 52 may have a width or diameter of about 0.200–0.300 inch, or holes 52 may have other dimensions such as a conical tapered shape. Thus, edge purge gas 23 flows from purge channels 40 through holes 52 to annular purge channel 53.

In heater 18 of the present invention, the bottom surface 43 of edge ring 37 forms the top surface of an annular purge channel 53, as shown in FIG. 2B. As seen in FIGS. 2B, 4A and 4B, top metal block 31 includes an outer side perimeter 50 and an inner side perimeter 51. The inner side perimeter of top metal block 31, bottom surface 43 of edge ring 37, top surface 61 of bottom metal block 33, and the inner surface of edge support ring 35 form annular purge channel 53 through which edge purge gases 23 from purge channels 40 flow. The edge purge gas 23 in channel 53 enters intermediate nozzle channels 38*a* on the bottom surface 43 of edge ring 37 and exits nozzles 38 from the top surface of top metal block 31 near the periphery of the substrate vacuum chucked onto top metal block 31 via vacuum grooves 29. Accordingly, undesired edge and backside surface deposition on the substrate 16 may be minimized.

Edge purge gas travels from purge gas inlet 39*c* to the multiple, radially and uniformly located purge channels 40 via channel conduits 40*a*, and then through holes 52 to annular purge channel 53, according to a specific embodiment of the present invention. The heater assembly of the present invention thus provides an edge purge gas having substantially uniform effective pressure at different locations regardless of which particular channel 40 the purge gas traveled. The use of multiple (for example, three to nine or more in various embodiments) generally symmetric, evenly-spaced, purge channels 40 extending radially from the center purge gas inlet 39*b–c* thus results in non-turbulent, smooth purge gas flow into annular purge channel 53. The heater also results in good film uniformity due to minimized differences in effective pressures of the purge gas at different locations in the annular purge channel 53.

From annular purge channel 53, the edge purge gas enters each intermediate nozzle channel 38*a* to its corresponding nozzle 38 where the edge purge gas gets evenly distributed to the edge surfaces of substrate 16. As previously mentioned, top metal block 31 includes integrated edge ring 37, formed by multiple edge purge gas nozzles 38 through top metal block 31, as seen in FIG. 4B. Preferably having a diameter ranging from about 0.015–0.060 inch, most preferably about 0.020–0.025 inch in a specific embodiment, and a length ranging from about 0.060–0.24 inch, most preferably about 0.08–0.10 inch, nozzles 38 are uniformly located and arranged in a circle having a diameter (preferably about 11.72 inches in the specific embodiment) less than the outer diameter of top metal block 31. The number of nozzles 38 are about 180–720, more preferably about 240–480 in the specific embodiment. Nozzles 38 are separated by a center-to-center distance preferably ranging from about 0.200–0.052 inch, more preferably about 0.155–0.076 inch, and most preferably about 0.100 inch. Intermediate between each nozzle 38 and annular purge channel 53 is intermediate nozzle channel 38*a*, formed from the bottom of top metal block 31, as seen in FIG. 4A. Intermediate nozzle channels 38*a* have a diameter greater than that of nozzles 38. Preferably having a diameter ranging from 0.030–0.125 inch, most preferably about 0.040–0.050 inch in a specific embodiment, and a depth ranging from about 0.040–0.100 inch, most preferably about 0.060–0.080 inch, intermediate nozzle channel 38*a* are also uniformly located and arranged in a circle having a diameter (preferably about 11.85 inches in the specific embodiment) less than the outer diameter of top metal block 31 but slightly greater than the diameter formed by nozzles 38 in the top surface of top metal block 31. The larger diameter of intermediate nozzle channels 38*a* compared to that of nozzles 38 provides intermediate chambers for edge purge gases 23 to exit from annular purge channel 53, to become more stable in flow and pressure, and then enter nozzles 38 with a uniform nozzle velocity and gas distribution. The preferred number of nozzles 38 and nozzle separation distance may be optimized for different process conditions to provide an even flow of edge purge gas across the span of several nozzles, resulting in an overall uniform purge gas flow from the ring of nozzles. It is noted that the diameter of the circles formed by nozzles 38 and by intermediate nozzle channels 38*a* are partly determined by the diameter of the substrate size and by the relation of its edge to edge ring 37 according to various specific embodiments such as shown for FIGS. 3A–3E. The circle of nozzles 38 effectively behaves as a slot and also maintains the structural integrity and strength of edge ring 37 in relation to top metal block 31, thereby advantageously eliminating warpage of the edge ring, even at processing temperatures reaching about 400° C. or greater.

As previously discussed, heater assembly 18 includes a vacuum clamping system having multiple grooves 29 formed in the top surface of top metal block 31. As seen in FIG. 4B, grooves 29 are in general concentrically circular grooves joined by radial grooves which correspond to the location of vertical vacuum conduits 45 in top metal block 31. Of course, vacuum grooves 29 are configured to avoid lift pin holes 49 in heater assembly 18. When the vacuum clamping system is maintained at vacuum by coupling vertical vacuum inlet 49, which enters heater assembly 18 through the bottom of bottom metal block 33, to a pumping system located away from chamber 12. Thus, the substantially uniform pattern of grooves 29 provides good clamping (for more reliable, improved thermal contact) of the substrate onto top metal block 31 of heater assembly 18, thereby enhancing rapid and uniform heating of substrate 16 by heater 18. Of course, other groove patterns and other geometric shaped grooves 29 may also be used in other specific embodiments.

In addition to top metal block 31, heater assembly 18 also includes bottom metal block 33. FIGS. 5A and 5B are top and bottom views, respectively, of one embodiment of bottom metal block 33 of heater assembly 18 of FIG. 2B. Cast within bottom metal block 33 is heater element 34 (shown in FIG. 2B and shown in dotted line in FIG. 5B). Heater element 34 is located within bottom metal block 33 approximately equidistant from the top and bottom surfaces 61 and 62 of bottom metal block 33. As mentioned above, heater element 34 is a three-loop heater element. Looping around in semi-circular arcs forming three "broken" concentric semi-circles about the center of heater 18, heater element 34 is a single resistively-heating element having electrodes 61*a* and 61*b* at each end that protrude from the central bottom portion 63 of bottom metal block 33. The placement of the multiple semi-circular arcs in heater element 34 provide good heating coverage of the wider diameter heater 18. Of course, the loops of heater element 34 avoid lift pin holes 49. Central bottom portion 63 has a shape similar to that of the shaft 65 to which it is brazed or otherwise connected, and aligned with stubs (not shown in FIG. 5B) disposed through holes 66.

Located above heater element 34 in bottom metal block 33 are vacuum passages 47, as seen in FIGS. 2B and 5A. In a specific embodiment, vacuum passages 47 are milled out of top surface 61 of bottom metal block 33. The side and bottom surfaces of vacuum passages 47 are formed in bottom metal block 33, and the top surface of vacuum passages 47 are provided by bottom surface 41 of top metal block 31, as shown in FIG. 6. As shown in FIG. 5A, which is a top view of bottom metal block 33 according to a specific embodiment, vacuum passages 47 include an annular vacuum passage having truncated spokes directed radially toward but not extending completely to the center of bottom metal block 33. Disposed completely through the thickness of bottom metal block 33 at its center is purge gas inlet 39*b*. Vacuum passages 47 may comprise multiple (three to nine or more in various embodiments, seven in the specific embodiment) truncated spokes. A specific one of the truncated spokes, which may be slightly longer than the other spokes, leads at its end to vertical vacuum inlet 49, leading to the vacuum pump used to provide vacuum clamping of substrate 16 to the top surface of top metal block 31 via vertical vacuum conduits 45 to vacuum grooves 29. Vacuum passages 47 generally have a width of about 0.250–0.500 inch and truncated spokes of vacuum passages 47 have a length of about 2.5–3.5 inches in specific embodiments. In preferred embodiments, the edges of vacuum passages 47 are curved. Vertical vacuum conduits 45 (formed through the thickness of top metal block 31) are located to substantially correspond with the location of the truncated spokes of vacuum passages 47 in bottom metal block 33. Being an input spoke, the specific truncated spoke of vacuum passages 47 leading to vertical vacuum inlet 49 does not correspond to the location of vertical vacuum conduits 45 in the specific embodiment.

In accordance with the specific embodiment, an alignment stub 63 located on bottom surface 41 of top metal block 31 fits into an alignment recess 64 located on top surface 61 of bottom metal block 33 such that top and bottom metal blocks 31 and 33 are properly aligned for brazing (or otherwise connecting) together with edge support ring 35 to form heater assembly 18. Alignment stub and recess 63 and 64 are used in addition to lift pin holes 49 for alignment during manufacture heater assembly 18, according to the specific embodiment. Of course, other alignment techniques also may be used in the manufacture of other embodiments. In the specific embodiment, top and bottom metal blocks 31 and 33 are aligned such that the placement of multiple purge channels 40 formed in top metal block 31 is offset from and does not coincide with the placement of multiple truncated spoke vacuum passages 47 formed in bottom metal block 33. The bottom surfaces of purge channels 40 are formed using the top surface 61 of bottom metal block 33, and the top surfaces of vacuum passages 47 are formed using the bottom surface 41 of top metal block 31. Thus, the purge channels 40 are isolated from the truncated spoke vacuum passages 47 so that gas from purge channels cannot enter the vacuum passages and so that gas from vacuum passages cannot enter purge channels. Of course, it is recognized that purge channels 40 may be formed in bottom metal block 33 and vacuum passages 47 may be formed in top metal block 31, or that purge channels 40 and vacuum passages 47 may both be formed in either the top metal block 31 or the bottom metal block 33 in other embodiments of the present invention with the appropriate changes being made to the specific embodiment, provided that the respective purge and vacuum systems are isolated from each other.

In a specific embodiment, heater assembly 18 may be equipped with a thermocouple, which may be inserted through shaft 65 and a hole 69 formed through bottom metal block 33 and through bottom surface 61 of top metal block. The thermocouple can thus measure the temperature of heater 18 close to the top surface of top metal block 31, near the substrate supported thereon. As seen in FIG. 5B, vertical purge inlet 39*b* is coupled to a slot 68 in central bottom portion 63 of bottom metal block 33, in accordance with a specific embodiment. In the specific embodiment, slot 68 is offset from the center of heater assembly 18 so that slot 68 coincides with vertical purge inlet 39*a* which is offset from the center of shaft 65. Slot 68 is offset from center primarily for space and geometrical constraint issues within shaft 65.

Figure 7A:
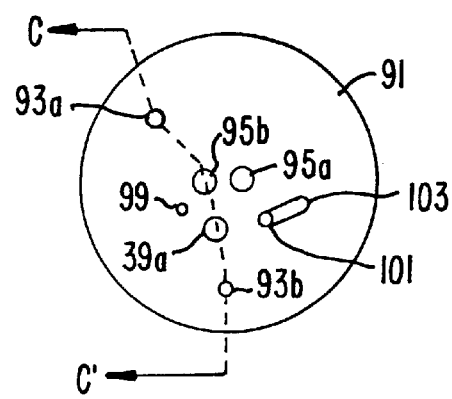
FIGS. 7A and 7B are a top view and a cross-sectional side view, respectively, of shaft 65 of heater assembly 18, according to an embodiment of the invention.
Figure 7B:
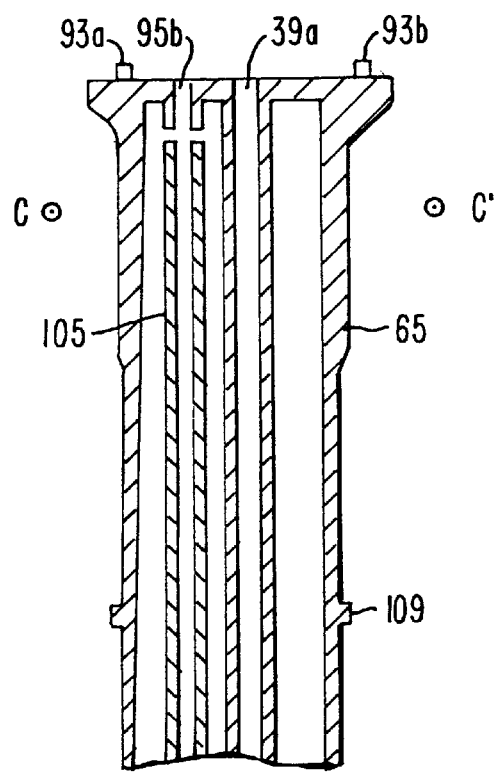

FIGS. 7A and 7B are a top view and cross-sectional side view, respectively, of shaft 65 of heater assembly 18 of FIG. 2B, according to an embodiment of the invention. Shaft 65 is made of aluminum in the specific embodiment, but may be made of other metals in other embodiments. In preferred embodiments, shaft 65 is hollow so that less heat is conducted down the length of shaft 65, thereby minimizing heat loss from heating element 34 of the heater and improving the temperature uniformity performance of heater assembly 18. FIG. 7A shows a top view of shaft 65, which includes a top face 91 with appropriate passages and stubs for attachment to central bottom portion 63 of bottom metal block 33 of heater assembly 18. More specifically, top face 91 includes alignment stubs 93*a* and 93*b* for respective placement into holes 66*a* and 66*b* (FIG. 5B). Shaft 65 also includes stub holes 95*a* and 95*b* through which ends of electrodes 61*a* and 61*b*, respectively, of heater element 34 are disposed for connection to a power supply and heating control system. Wiring connecting to the ends of electrodes 61*a* and 61*b* is isolated within shaft 65 by ceramic sleeves such as, for example, a ceramic sleeve 105 through which wiring connected to electrode 61*b* (entering shaft 65 via hole 95*b*) is disposed, as shown in FIG. 7B. Additionally, top face 91 of shaft 65 includes an appropriate hole 99 through which a thermocouple may be inserted into hole 69 of bottom metal block 33. Optionally, a passage may be provided to connect to hole 99 to act as a guide within shaft 65 for the thermocouple. Passage 39*a* (in specific embodiments made of aluminum and which may be an integral part of shaft 65 or be welded or brazed to shaft 65) acts as vertical purge inlet 39*a* and is coupled to vertical purge inlet 39*b* via slot 68 in central bottom portion 63. Passage 101 may be similarly formed as passage 39*a* within shaft 65 so that there is no leak path between passages 101 and 39*a*, between passage 101 and outside shaft 65, and between passage 39a and outside shaft 65. Providing the inlet to the vacuum chucking system, passage 101 is coupled via an offset slot 103 formed in top face 91 to lead to vacuum inlet 49 of central bottom portion 63. Shaft 65 also may include an optional shoulder 109 for use by a lifting mechanism such as described in U.S. patent application Ser. No. 08/738,240, previously incorporated by reference. Embodiments of shaft 65 without shoulder 109 may be used with a lift mechanism such as described in U.S. patent application Ser. No. 08/892,612, previously incorporated by reference. Although not shown in FIG. 7B, the base of vertical purge passage 39a at the bottom of shaft 65 includes a sealing member, such as an O-ring, to maintain a gas seal. Similarly, the base of vacuum passage 101 at the bottom of shaft 65 also includes a sealing member to maintain the vacuum seal. Appropriate electrical connections for wiring from electrodes 61a and 61b also are made at the base of shaft 65, with the use of sealing members if needed.

The above CVD system description is mainly for illustrative purposes and should not be considered as limiting the scope of the present invention. Variations of the above described system, such as variations of platen or susceptor design, heater design, location of RF power connections and others are possible. The heater design of the present invention is not limited to use with any specific processing apparatus.

III. High Temperature Multiple-Step Processes Using the CVD Reactor System

A. Exemplary Structures and Applications

Exemplary Structures

Figure 8:
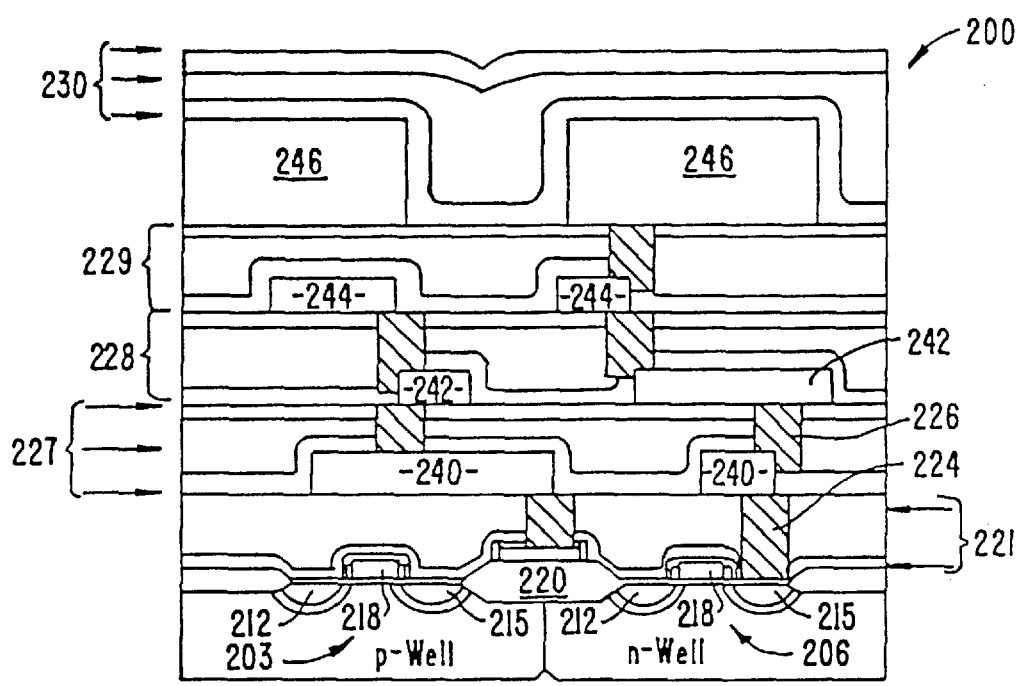
FIG. 8 is a simplified cross-sectional view of a semiconductor device manufactured according to an embodiment of the present invention.

FIG. 8 illustrates a simplified cross-sectional view of an integrated circuit 200 which may utilize the exemplary tungsten film deposited in accordance with an embodiment of the present invention. As shown, integrated circuit 200 includes NMOS and PMOS transistors 203 and 206. Each transistor 203 and 206 comprises a source region 212, a drain region 215 and a gate region 218. The transistors are electrically isolated from each other by field oxide region 220, formed by local oxidation of silicon (LOCOS) or other technique. Alternatively, trench isolation structures may be used to isolate the transistors.

A premetal dielectric (PMD) layer 221 separates transistors 203 and 206 from metal layer 240 with connections between metal layer 240 and the transistors made by contacts 224. Metal layer 240 is one of four metal layers (240, 242, 244 and 246) included in integrated circuit 200. Each metal layer is separated from the other by respective inter-metal dielectric layers 227, 228 and 229. Adjacent metal layers are connected at selected openings by vias 226, which are commonly tungsten plugs. Deposited over metal layer 246 are planarized passivation layers 230.

It should be understood that simplified integrated circuit 200 is for illustrative purposes only. One of ordinary skill in the art would be able to implement the present invention for fabrication of other films for use in integrated circuits such as microprocessors, application-specific integrated circuits (ASICs), memory devices, and the like.

Exemplary Process

The present invention may be used to deposit a thin film, such as tungsten, in exemplary CVD apparatus 10 or other substrate processing apparatus. A process for the CVD deposition of a tungsten film over a substrate is illustrated below as an example of a CVD process with which the present invention may be used. It is understood that the illustration below is for exemplary purposes only and that the present invention is not limited to depositing films from the exemplary process. This process is implemented and controlled using a computer program stored in the memory 46 of CVD system 10.

In the exemplary process, a tungsten film is deposited over a wafer 16 positioned in processing chamber 12. The deposition sequence includes two main steps: nucleation and bulk deposition. The nucleation step grows a thin layer of tungsten that acts as a growth site for subsequent film. In the nucleation growth step, a process gas including tungsten hexafluoride ($WF_6$), silane ($SiH_4$), nitrogen ($N_2$), hydrogen ($H_2$) and argon (Ar) is introduced into the chamber and the chamber is heated and pressurized to selected levels to deposit the initial tungsten seed layer for further deposition.

After completion of the nucleation step, a bulk deposition step is undertaken to deposit the remainder of the tungsten film. In the bulk deposition step, a process gas mixture containing $WF_6$, $N_2$, $H_2$ and Ar is introduced into the chamber. This process gas contains a higher percentage of $WF_6$ than does the process gas for the nucleation step. An edge purge gas may be used during both the nucleation and bulk deposition steps to prevent deposition on the edge and backside of the wafer as well as the susceptor as described in reference to the exemplary chamber. The purge gas does not, however, prevent deposition from all unwanted areas of the chamber, and therefore does not alleviate the need for a dry clean step.

In one preferred process, $WF_6$ is introduced into the chamber at a rate of about 30–50 standard cubic centimeters per minute (sccm), $SiH_4$ is introduced at a rate of about 15–25 sccm, $N_2$ is introduced at a rate of about 450–750 sccm, $H_2$ is introduced at a rate of about 1500–2500 sccm and Ar is introduced at a rate of about 1500–2500 sccm during deposition of the nucleation layer. The wafer is heated to about 450° C. and pressure is maintained at about 1–10 torr, preferably about 4.5 torr, during the nucleation layer deposition. Next, during deposition of the bulk layer, $WF_6$ is introduced into the chamber at a rate of about 140–240 sccm, $N_2$ is introduced at a rate of about 450–750 sccm, $H_2$ is introduced at a rate of about 1050–1750 sccm and Ar is introduced at a rate of about 1500–2500 sccm.

In this preferred process, the edge purge gas contains only Ar introduced at a rate of about 750–1250 sccm during the nucleation step, and contains both Ar and $H_2$ introduced at rates of about 2700–4000 sccm and about 495–825 sccm, respectively, during the bulk deposition step. Hydrogen may be added to the purge gas to enhance deposition at the edge of the substrate.

Although the tungsten deposition process conditions described above are exemplary for the present embodiment, other conditions may also be used. The above description discusses deposition of tungsten merely as an example of substrate processing that is possible in a W×Z chamber available from Applied Materials fitted for 300-mm wafers and having about 15 liters total volume, but other various substrate processes are possible. The above descriptions for deposition are stated to occur at preferred temperatures (for example, about 450° C.), but it is noted the present invention may be used for other processes at lower or higher temperatures.

IV. Conclusion

It is to be understood that the above description is intended to be illustrative and not restrictive. Many embodiments will be apparent to those of skill in the art upon reviewing the above description. By way of example, the inventions herein have been illustrated primarily with regard to tungsten process recipes, but they are not so limited. Heater 18 will be useful for depositing thin, uniform films such as a tungsten film at process temperatures of about 400° C. However, heater 18 also may be used to deposit other types of thin uniform films at temperatures ranging from 200–450° C. for heaters made primarily of aluminum in other applications. For other specific embodiments where heater 18 is made of other materials, such as Hastelloy™ or Haynes™ 242 or other metal alloy capable of heating to higher temperatures, heater 18 may be used to deposit thin uniform films at temperatures greater than 450° C. The various dimensions described above for the specific embodiments should not necessarily be considered limiting for heater assemblies having larger or smaller diameters. Of course, the above description should not be considered as limiting the scope of the invention. The film formed according to other embodiments may be other types of metal-containing films, undoped dielectric films, doped dielectric films, polysilicon films, or other films. Of course, it is recognized that the same CVD apparatus discussed above may be used to deposit dielectric layers at temperatures lower than about 400° C., as well as temperatures above 500° C. Additionally, various aspects of the present invention may also be used for other applications. Those skilled in the art will recognize other equivalent or alternative embodiments while remaining within the scope of the claims of the present invention. The scope of the invention should, therefore, be determined not with reference to the above description, but should instead be determined with reference to the appended claims, along with the full scope of equivalents to which such claims are entitled.

What is claimed is:

1. A heater assembly for use in a substrate processing apparatus, said heater assembly comprising:
    a metal pedestal including a surface for supporting a substrate;
    a resistive heating element disposed in said metal pedestal; and
    a purge gas channel system disposed in said metal pedestal, said purge gas channel system comprising:
        a central purge gas inlet located substantially at a center of said metal pedestal, said central purge gas inlet for providing a purge gas,
        a plurality of radial purge gas channels radiating from said central purge gas inlet out toward a perimeter of said metal pedestal, said plurality of radial purge gas channels forming a substantially symmetric pattern.

2. The assembly of claim 1 further comprising an annular purge gas channel formed in said metal pedestal at said perimeter, said annular purge gas channel coupled to said surface via a plurality of holes near said perimeter to provide a purge guide ring integral to said metal pedestal.

3. The assembly of claim 1 wherein metal pedestal comprises a top metal block and a bottom metal block connected to said top metal block.

4. The assembly of claim 3 wherein said plurality of radial purge gas channels are formed in said top metal block.

5. The assembly of claim 4 wherein top and side portions of said plurality of radial purge gas channels are formed in a bottom surface of said top metal block and bottom portions of said plurality of radial purge gas channels are formed with a top surface of said bottom metal block.

6. The assembly of claim 5 wherein said metal pedestal further comprises an edge support ring disposed around said top metal block, and wherein an inner wall and an upper surface of said annular purge channel is formed in said top metal block, an outer wall of said annular purge channel is formed with said edge support ring, and a lower surface of said annular purge channel is formed with said top surface of said bottom metal block.

7. The assembly of claim 6 further comprising:
    a vacuum chucking system formed in said metal pedestal, said vacuum chucking system including:
    a plurality of vacuum grooves disposed in said surface of said metal pedestal, said grooves for providing chucking of a substrate to said metal pedestal;
    a plurality of vacuum passages, said plurality of vacuum passages including an annular vacuum passage, and a plurality of truncated spoke vacuum passages each coupled to said annular vacuum passage;
    a plurality of vacuum conduits, said plurality of vacuum conduits coupling at least one of said plurality of vacuum passages to at least one of said vacuum grooves.

8. The assembly of claim 7 wherein said plurality of vacuum passages are formed in said bottom metal block, said top metal block and said bottom metal block being aligned such that said plurality of radial purge channels are offset and isolated from said plurality of truncated spoke vacuum passages.

9. The assembly of claim 6 wherein said top and bottom metal blocks and said edge support ring are comprised of aluminum.

10. The assembly of claim 9 wherein said top and bottom metal blocks are brazed together.

11. The assembly of claim 10 further comprising an aluminum shaft brazed together with said top and bottom metal blocks.

12. The assembly of claim 3 wherein said resistive heating element is cast into said bottom metal block, said resistive heating element having multiple loops forming three "broken" concentric semi-circles within said bottom metal block.

13. The assembly of claim 1 further comprising a vacuum chucking system formed in said metal pedestal, said vacuum chucking system including:
    a plurality of vacuum grooves disposed in said surface of said metal pedestal, said grooves for providing chucking of a substrate to said metal pedestal;
    a plurality of vacuum passages formed in a first part of said metal pedestal, said plurality of vacuum passages including an annular vacuum passage, and a plurality of truncated spoke vacuum passages each coupled to said annular vacuum passage;
    a plurality of vacuum conduits, said plurality of vacuum conduits coupling at least one of said plurality of vacuum passages to at least one of said vacuum grooves; and
    wherein said plurality of radial purge gas channels are formed in a second part of said metal pedestal, said first and second parts of said metal pedestal connected to each other to form said plurality of vacuum passages and said plurality of radial purge gas channels such that said plurality of radial purge channels are offset and isolated from said plurality of truncated spoke vacuum passages.

14. The assembly of claim 1 wherein said metal pedestal is capable of supporting and uniformly heating a substrate having a diameter of about 300 mm or greater.

15. The assembly of claim 1 wherein said plurality of purge gas channels have approximately the same length.

16. A heater assembly for use in a substrate processing apparatus, said heater assembly comprising:
    a pedestal including a surface for supporting a substrate;
    a heating element disposed in said pedestal; and
    a purge gas channel system disposed in said pedestal, said purge gas channel system comprising:

a central purge gas inlet located substantially at a center of said pedestal, and a plurality of radial purge gas channels coupled with said central purge gas inlet, said radial purge gas channels oriented radially relative to said central purge gas inlet and extending toward a perimeter of said pedestal, said plurality of radial purge gas channels forming a substantially symmetric pattern with respect to said central purge gas inlet.

17. The heater assembly of claim 16 wherein said purge gas channel system includes at least three said radial purge gas channels.

18. The heater assembly of claim 17 wherein said purge gas channel system includes 3–9 said radial purge gas channels.

19. The heater assembly of claim 16 wherein said purge gas channels include curved edges.

20. A heater assembly for use in a substrate processing apparatus, said heater assembly comprising:

a pedestal including a surface for supporting a substrate;

a heating element disposed in said pedestal; and a purge gas channel system disposed in said pedestal, said purge gas channel system comprising:

a central purge gas inlet located substantially at a center of said pedestal, and a plurality of radial purge gas channels coupled with said central purge gas inlet via a plurality of channel conduits radiating from said central purge gas inlet, said radial purge gas channels oriented radially relative to said central purge gas inlet and extending toward a perimeter of said pedestal, said plurality of radial purge gas channels forming a substantially symmetric pattern with respect to said central purge gas inlet.

21. The heater assembly of claim 20 wherein said purge gas channels are larger in width than said channel conduits.

* * * * *